United States Patent
Hiromura et al.

(10) Patent No.: US 9,005,362 B2
(45) Date of Patent: Apr. 14, 2015

(54) METHOD FOR GROWING GROUP III NITRIDE CRYSTAL

(75) Inventors: Yuki Hiromura, Itami (JP); Koji Uematsu, Itami (JP); Hiroaki Yoshida, Itami (JP); Shinsuke Fujiwara, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 945 days.

(21) Appl. No.: 13/115,560

(22) Filed: May 25, 2011

(65) Prior Publication Data

US 2012/0031324 A1    Feb. 9, 2012

(30) Foreign Application Priority Data

Aug. 3, 2010  (JP) .................. 2010-174534

(51) Int. Cl.
C30B 21/02 (2006.01)
H01L 21/02 (2006.01)
C30B 25/18 (2006.01)
C30B 29/40 (2006.01)

(52) U.S. Cl.
CPC .......... *H01L 21/02389* (2013.01); *C30B 25/18* (2013.01); *C30B 29/403* (2013.01); *H01L 21/0243* (2013.01); *H01L 21/02433* (2013.01); *H01L 21/0254* (2013.01); *H01L 21/0262* (2013.01); *H01L 21/02658* (2013.01)

(58) Field of Classification Search
USPC .................. 117/86, 90, 94, 95, 101
See application file for complete search history.

(56) References Cited

U.S. PATENT DOCUMENTS

| | | | |
|---|---|---|---|
| 2012/0112320 A1* | 5/2012 | Kubo et al. | 257/615 |
| 2012/0223417 A1* | 9/2012 | Ishibashi et al. | 257/615 |
| 2012/0267606 A1* | 10/2012 | Ishibashi et al. | 257/13 |

FOREIGN PATENT DOCUMENTS

| | | |
|---|---|---|
| JP | 03-075298 A | 3/1991 |
| JP | 2000-349338 | 12/2000 |
| JP | 2006-315947 A | 11/2006 |
| JP | 2008-133151 | 6/2008 |
| JP | 2008-143772 A | 6/2008 |
| JP | 2008-308401 A | 12/2008 |
| JP | 2009-046377 A | 3/2009 |
| JP | 2011-026181 A | 2/2011 |

* cited by examiner

*Primary Examiner* — Bob M Kunemund
(74) *Attorney, Agent, or Firm* — Drinker Biddle & Reath LLP

(57) ABSTRACT

The present invention is to provide a method for growing a group III nitride crystal that has a large size and has a small number of pits formed in the main surface of the crystal by using a plurality of tile substrates. A method for growing a group III nitride crystal includes a step of preparing a plurality of tile substrates 10 including main surfaces 10*m* having a shape of a triangle or a convex quadrangle that allows two-dimensional close packing of the plurality of tile substrates; a step of arranging the plurality of tile substrates 10 so as to be two-dimensionally closely packed such that, at any point across which vertexes of the plurality of tile substrates 10 oppose one another, 3 or less of the vertexes oppose one another; and a step of growing a group III nitride crystal 20 on the main surfaces 10*m* of the plurality of tile substrates arranged.

5 Claims, 4 Drawing Sheets

Shorter distance out of distances between any two neighboring points (μm)

METHOD FOR GROWING GROUP III NITRIDE CRYSTAL

TECHNICAL FIELD

The present invention relates to a method for growing a group III nitride crystal on main surfaces of a plurality of tile substrates.

BACKGROUND ART

Group III nitride crystals are suitably used in semiconductor devices such as light-emitting devices and electronic devices. To reduce the cost of such group III nitride crystals, group III nitride crystals having a large size have been demanded.

Since group III nitride crystals that have a large size are not found in nature, group III nitride crystals are grown on substrates (base substrates) that are composed of materials represented by chemical formulae other than those of group III nitride crystals. For example, Japanese Unexamined Patent Application Publication No. 2000-349338 discloses a method for growing a group III nitride (GaN) crystal film having a large thickness without warping or cracking on a substrate (base substrate) that is composed of a material represented by a chemical formula other than that of the group III nitride crystal.

However, it is difficult to grow a group III nitride crystal having a sufficiently large size by the method disclosed in Japanese Unexamined Patent Application Publication No. 2000-349338. This is because, when a base substrate has a large main surface area, crystal lattice mismatch between a group III nitride crystal and the base substrate increases distortion within the group III nitride crystal and, as a result, the crystal warps or cracks.

To address such a problem, Japanese Unexamined Patent Application Publication No. 2008-133151 discloses a crystal growth method including a step of arranging a plurality of seed substrates such that sides of the seed substrates are adjacent to each other and a step of growing group III nitride crystals on the surfaces of the plurality of seed substrates by a hydride vapor phase epitaxy method (hereafter, abbreviated as an HVPE method) such that the crystals are integrated.

SUMMARY OF INVENTION

Technical Problems

However, such group III nitride crystals grown through integration by the crystal growth method disclosed in Japanese Unexamined Patent Application Publication No. 2008-133151 have a large number of pits formed in the main surfaces of the crystals. Thus, the yield of group III nitride crystal substrates from such group III nitride crystals is not sufficiently high.

Accordingly, an object of the present invention is to provide a method for growing a group III nitride crystal that has a large size and has a small number of pits formed in the main surface of the crystal by using a plurality of tile substrates. Group III nitride crystal substrates having a large size can be obtained in a high yield from such group III nitride crystals that have a large size and have a small number of pits.

Solution to Problems

A method for growing a group III nitride crystal according to an embodiment of the present invention includes a step of preparing a plurality of tile substrates including main surfaces having a shape of a triangle or a convex quadrangle that allows two-dimensional close packing of the plurality of tile substrates; a step of arranging the plurality of tile substrates so as to be two-dimensionally closely packed such that, at any point across which vertexes of the plurality of tile substrates oppose one another, 3 or less of the vertexes oppose one another; and a step of growing a group III nitride crystal on the main surfaces of the plurality of tile substrates arranged.

In the method for growing a group III nitride crystal according to the present invention, the shape of the main surfaces of the tile substrate may be the convex quadrangle that allows two-dimensional close packing of the plurality of tile substrates. The tile substrate may be GaN substrates. In the step of growing the group III nitride crystal, a GaN crystal may be grown as the group III nitride crystal in a temperature range of 900° C. or more and 1100° C. or less by a hydride vapor phase epitaxy method. In the step of arranging the plurality of tile substrates so as to be two-dimensionally closely packed, the plurality of tile substrates may be arranged such that a distance between any two neighboring points among the points across which the vertexes of the plurality of tile substrates oppose one another is 10 µm or more.

Advantageous Effects of Invention

The present invention provides a method for growing a group III nitride crystal, wherein the group III nitride crystal has a large size and has a small number of pits formed in the main surface of the crystal by using a plurality of tile substrates.

DESCRIPTION OF EMBODIMENTS

Figure 1A:
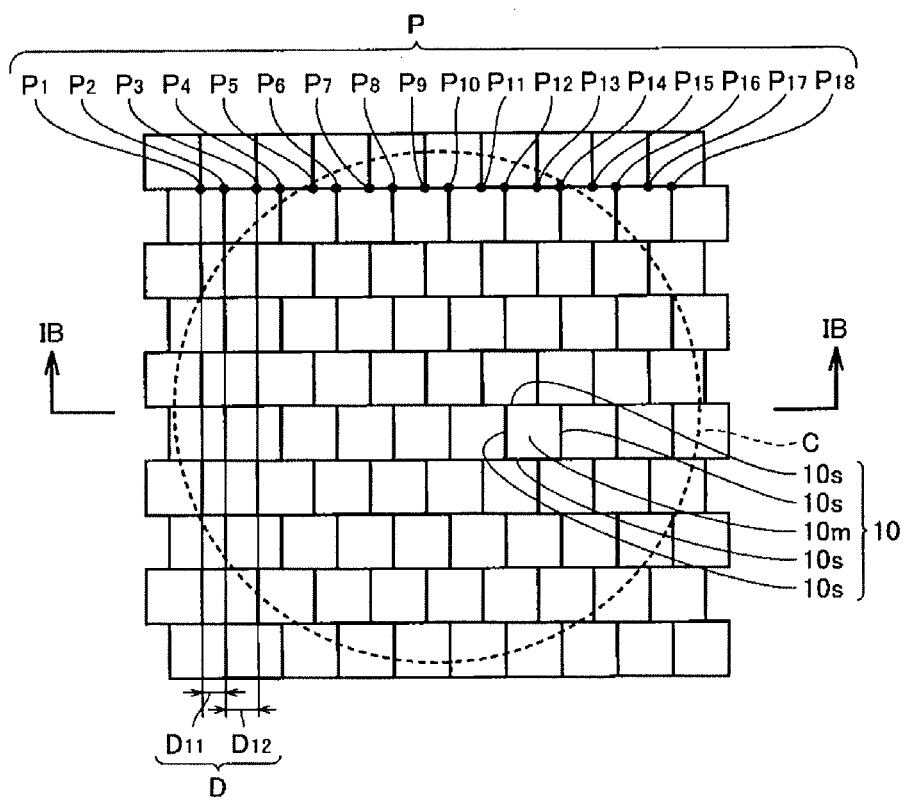
FIG. 1A is a schematic view illustrating one example of steps of preparing and arranging tile substrates in a method for growing a group III nitride crystal according to an embodiment of the present invention and is a schematic plan view of arranged tile substrates.
Figure 1B:
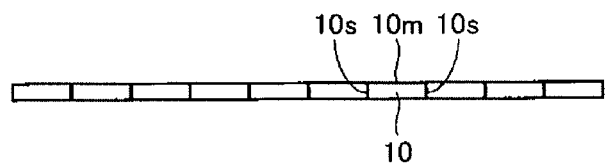
FIG. 1B is a schematic view illustrating one example of steps of preparing and arranging tile substrates in a method for growing a group III nitride crystal according to an embodiment of the present invention and is a schematic sectional view taken along line IB-IB in FIG. 1A.
Figure 2:
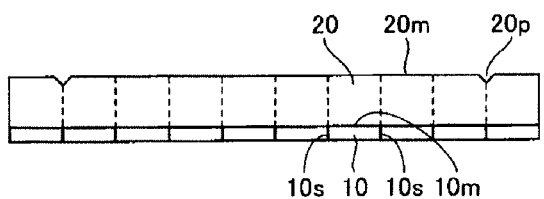
FIG. 2 is a schematic sectional view illustrating a step of growing a group III nitride crystal in a method for growing a group III nitride crystal according to an embodiment of the present invention.

Referring to FIGS. 1A, 1B, and 2, a method for growing a group III nitride crystal according to an embodiment of the present invention includes a step of preparing a plurality of tile substrates 10 including main surfaces 10m having a shape of a triangle or a convex quadrangle that allows two-dimensional close packing of the plurality of tile substrates 10 (FIGS. 1A and 1B); a step of arranging the plurality of tile substrates 10 so as to be two-dimensionally closely packed such that, at any point P across which vertexes of the plurality of tile substrates 10 oppose one another, three or less of the vertexes oppose one another (FIGS. 1A and 1B); and a step of growing a group III nitride crystal 20 on the main surfaces 10m of the plurality of tile substrates 10 arranged (FIG. 2). The method for growing a group III nitride crystal according to this embodiment provides the group III nitride crystal 20 that has a large size and has a small number of pits 20p formed in a main surface 20m of the group III nitride crystal 20.
Tile-Substrate Preparation Step Referring to FIGS. 1A and 1B, the method for growing a group III nitride crystal according to this embodiment includes a step (tile-substrate preparation step) of preparing the plurality of tile substrates 10 including the main surfaces 10m having the shape of a triangle or a convex quadrangle that allows two-dimensional close packing of the plurality of tile substrates 10.

The term "two-dimensional close packing" refers to an operation of two-dimensionally closely laying tile substrates having a certain shape. The main surfaces 10m of the tile substrates 10 have the shape of a triangle or a convex quadrangle that allows two-dimensional close packing of the tile substrates 10. The term "convex quadrangle" refers to a quadrangle in which the four vertexes project outward, that is, a quadrangle in which the four interior angles are less than 180°. A triangle that allows two-dimensional close packing may be any triangle and is preferably, for example, a regular triangle, an isosceles triangle, or a right triangle, in view of ease of production of tile substrates. A convex quadrangle that allows two-dimensional close packing may be any parallelogram and is preferably, for example, a square, a rectangle, or a rhombus, in view of ease of production of tile substrates.

The size of the tile substrates 10 is not particularly limited. To achieve easy handling, in the main surfaces 10m of the tile substrates 10, the shortest sides preferably have a length of 10 mm or more and the longest sides preferably have a length of 50 mm or less. The thickness of the tile substrates 10 is not particularly limited. To achieve a high mechanical strength and easy handling, the tile substrates 10 preferably have a thickness of 100 μm or more and 2,000 μm or less.

The tile substrates 10 are not particularly limited as long as the group III nitride crystal 20 can be epitaxially grown on the main surfaces 10m of the tile substrates 10. As the tile substrates 10, sapphire substrates, silicon carbide (SiC) substrates, GaAs substrates, or group III nitride substrates are preferably used because the lattice constant of such a substrate and a group III nitride crystal closely match and a group III nitride crystal having high crystallinity can be grown on the substrate. In particular, group III nitride substrates are preferably used. When a GaN crystal is grown as a group III nitride crystal, GaN substrates are preferably used.

The procedure of preparing the tile substrates 10 is not particularly limited. For example, the tile substrates 10 are prepared by cutting a bulk crystal along predetermined crystal planes and subjecting the main surfaces 10m and side surfaces 10s of the resultant substrates to a surface treatment such as polishing or etching. However, the tile substrates 10 whose side surfaces 10s are not surface-treated can be used as long as the main surfaces 10m are surface-treated as described above. To epitaxially grow a group III nitride crystal having high crystallinity on the main surfaces 10m of the tile substrates 10, the main surfaces 10m and the side surfaces 10s of the tile substrates 10 preferably have predetermined plane orientations. For example, when the tile substrates 10 are sapphire substrates having a corundum crystal structure that can be regarded as a hexagonal system, 2H-, 4H-, 6H-, 8H-, or 1 OH-SiC substrates having a crystal structure of a hexagonal system, or group III nitride substrates having a wurtzite crystal structure of a hexagonal system (in particular, GaN substrates), the main surfaces 10m of the tile substrates 10 are preferably in a (0001) plane and the side surfaces 10s of the tile substrates 10 are preferably in planes selected from a {1-100} plane (M plane), a {11-20} plane (A plane), a {31-40} plane, and a plane perpendicular to both the {31-40} plane and the {0001} plane (note that the {31-40} plane and the plane perpendicular to both the {31-40} plane and the {0001} plane both have plane orientations between the M plane and the A plane). When the tile substrates 10 are GaAs substrates having a zinc-blende crystal structure of a cubic system, the main surfaces 10m of the tile substrates 10 preferably are in a (111) plane and the side surfaces 10s of the tile substrates 10 are preferably in, for example, a {1-10} plane and a {001} plane.

To epitaxially grow an integrated group III nitride crystal having high crystallinity on the main surfaces 10m of the tile substrates 10 being arranged, the main surfaces 10m preferably have a mean roughness Ra of 20 nm or less, more preferably 5 nm or less; and the side surfaces 10s of the tile substrates 10 preferably have a mean roughness Ra of 20 nm or less, more preferably 5 nm or less. The term "mean roughness Ra" refers to arithmetical mean roughness Ra defined in JIS B0601:2001 and is specifically determined in the following manner. A roughness profile is sampled over a sampling length in the direction of a mean line. The total of distances between the mean line and the roughness profile (absolute values of deviation) in the sample is determined. The total value is averaged with the sampling length to provide a mean roughness Ra. The mean roughness Ra is determined with an atomic force microscope (AFM).

To achieve closer two-dimensional packing of the tile substrates 10, variation in the dimensions of the tile substrates 10 is preferably made within certain ranges. Variation in the interior angles of vertexes of the tile substrates 10 is preferably within ±1°, more preferably ±0.1°, relative to the average of the interior angles. Variation in the lengths of sides of the tile substrates 10 is preferably within ±5 μm, more preferably ±1 μm, relative to the average of the lengths.
Tile-Substrate Arrangement Step Referring to FIGS. 1A and 1B, the method for growing a group III nitride crystal according to the embodiment further includes a step (tile-substrate arrangement step) of arranging the plurality of tile substrates 10 so as to be two-dimensionally closely packed such that, at any point P across which vertexes of the plurality of tile substrates 10 oppose one another, 3 or less of the vertexes oppose one another. By arranging the plurality of tile substrates in such a manner, referring to FIG. 2, the group III nitride crystal 20 that has a large size and has a small number of pits 20p formed in a main surface 20m can be grown on the main surfaces 10m.

Figure 3:
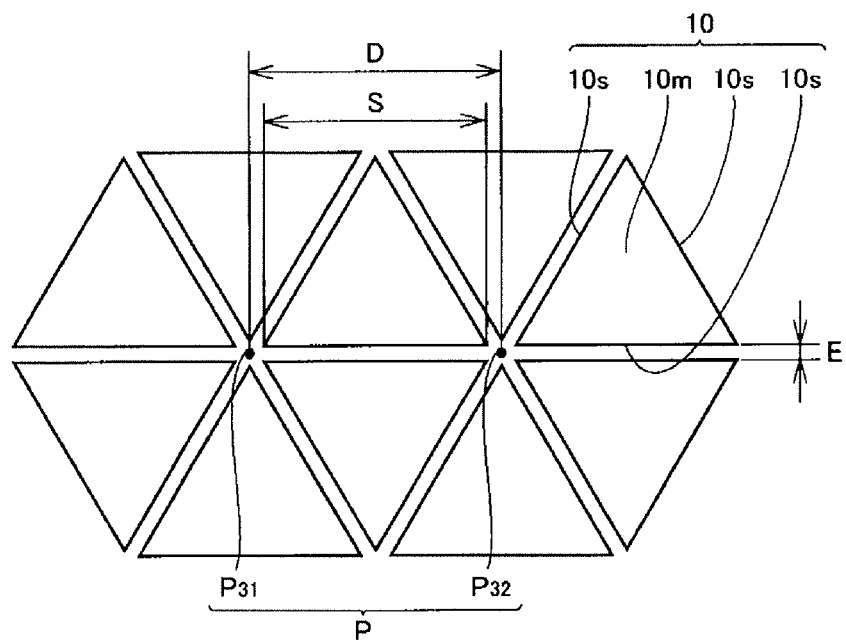
FIG. 3 is a schematic plan view of an arrangement example of tile substrates in an existing method for growing a group III nitride crystal.

Referring to FIG. 3, in an existing method for growing a group III nitride crystal, tile substrates 10 including main surfaces 10m having the shape of, for example, a regular triangle are arranged so as to be two-dimensionally closely packed such that vertexes of the tile substrates 10 oppose one another. Specifically, at points P across which vertexes of the tile substrates 10 oppose one another (for example, points $P_{31}$ and $P_{32}$), six vertexes oppose one another at each point P. The tile substrates 10 arranged in this manner have large gaps at points P across which vertexes of the tile substrates 10 oppose one another and hence a group III nitride crystal epitaxially grown on the tile substrates 10 has a large number of pits formed in the main surface of the crystal. Thus, the yield of group III nitride crystal substrates from such group III nitride crystals is low.

In the two-dimensional close packing in FIG. 3, distance D between any two neighboring points (for example, points $P_{31}$ and $P_{32}$) among points P across which vertexes of the tile substrates 10 oppose one another equals to distance $D_0$ that is the sum of length S of a side of a tile substrate 10 including a regular-triangle main surface and distance E between opposite side surfaces of neighboring tile substrates 10 ($D_0$=S+E, and D=$D_0$).

Figure 4:
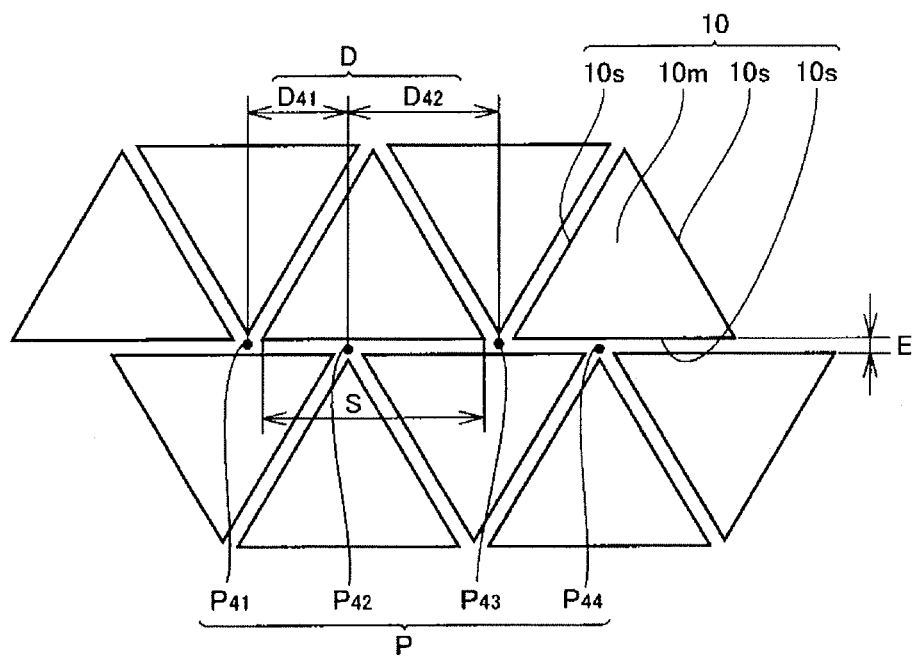
FIG. 4 is a schematic plan view of an arrangement example of tile substrates in a method for growing a group III nitride crystal according to an embodiment of the present invention.

In contrast, referring to FIG. 4, in the method for growing a group III nitride crystal according to the embodiment of the present invention, the tile substrates 10 including the main surfaces 10m having the shape of, for example, a regular triangle are arranged so as to be two-dimensionally closely packed such that some of the tile substrates 10 and the other tile substrates 10 are arranged by being shifted each other, and thus the vertexes of some of the tile substrates 10 do not oppose those of the other tile substrates 10. Specifically, at points P across which vertexes of the tile substrates 10 oppose one another (for example, points $P_{41}$, $P_{42}$, $P_{43}$, and $P_{44}$), three vertexes oppose one another at each point P. Thus, as a result of such two-dimensional close packing, at any point P across which vertexes of the tile substrates 10 oppose one another, three or less of the vertexes can be made to oppose one another. In the tile substrates 10 arranged in this manner, although there are a large number of points P (for example, points $P_{41}$, $P_{42}$, $P_{43}$, and $P_{44}$) across which vertexes of the tile substrates 10 oppose one another, gaps at the points P are small and hence a group III nitride crystal epitaxially grown on the tile substrates 10 has a small number of pits formed in the main surface of the crystal. Thus, the yield of group III nitride crystal substrates from such group III nitride crystals is high.

In the two-dimensional close packing in FIG. 4, as for distance D between two neighboring points among a plurality of points P across which vertexes of the tile substrates 10 oppose one another, there are cases where, for example, distance $D_{41}$ between points $P_{41}$ and $P_{42}$ is different from distance $D_{42}$ between points $P_{42}$ and $P_{43}$. Distance $D_{41}$, distance $D_{42}$, and distance $D_0$ satisfy $D_0=D_{41}+D_{42}$. Distance $D_0$ is the sum of length S of a side of a tile substrate 10 including a regular-triangle main surface and distance E between opposite side surfaces of neighboring tile substrates 10.

To further reduce the number of pits formed in the main surface of a group III nitride crystal epitaxially grown on the tile substrates 10, the distance between any two neighboring points among points P across which vertexes of the tile substrates 10 oppose one another (in FIG. 4, distances $D_{41}$ and $D_{42}$) is preferably 10 μM or more, more preferably 100 μm or more, still more preferably 1,000 μm or more.

To epitaxially grow an integrated group III nitride crystal on the tile substrates 10 and to reduce the number of pits formed in the main surface of the grown group III nitride crystal, distance E between opposite side surfaces of neighboring tile substrate 10 is preferably 20 μm or less, more preferably 10 μm or less, still more preferably 2 μm or less, ideally 0 μm.

The cases where the main surfaces of the tile substrates have the shape of a regular triangle have been described with reference to FIGS. 3 and 4. Such description is similarly applied to cases where the main surfaces of the tile substrates have the shape of an isosceles triangle, a right triangle, and any other triangle.

Figure 5:
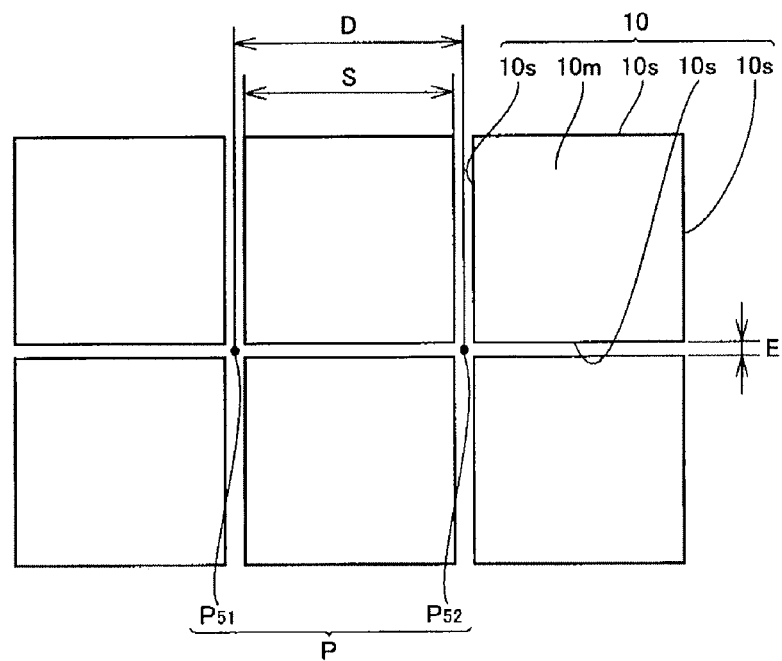
FIG. 5 is a schematic plan view of another arrangement example of tile substrates in an existing method for growing a group III nitride crystal.

Referring to FIG. 5, in an existing method for growing a group III nitride crystal, tile substrates 10 including main surfaces 10m having the shape of, for example, a square are arranged so as to be two-dimensionally closely packed such that vertexes of the tile substrates 10 oppose one another. Specifically, at points P across which vertexes of the tile substrates 10 oppose one another (for example, points $P_{51}$ and $P_{52}$), four vertexes oppose one another at each point P. The tile substrates 10 arranged in this manner have large gaps at points P across which vertexes of the tile substrates 10 oppose one another and hence a group III nitride crystal epitaxially grown on the tile substrates 10 has a large number of pits formed in the main surface of the crystal. Thus, the yield of group III nitride crystal substrates from such group III nitride crystals is low.

In the two-dimensional close packing in FIG. 5, distance D between any two neighboring points (for example, points $P_{51}$ and $P_{52}$) among points P across which vertexes of the tile substrates 10 oppose one another equals to distance $D_0$ that is the sum of length S of a side of a tile substrate 10 including a square main surface and distance E between opposite side surfaces of neighboring tile substrates 10 ($D_0$=S+E, and D=$D_0$).

Figure 6:
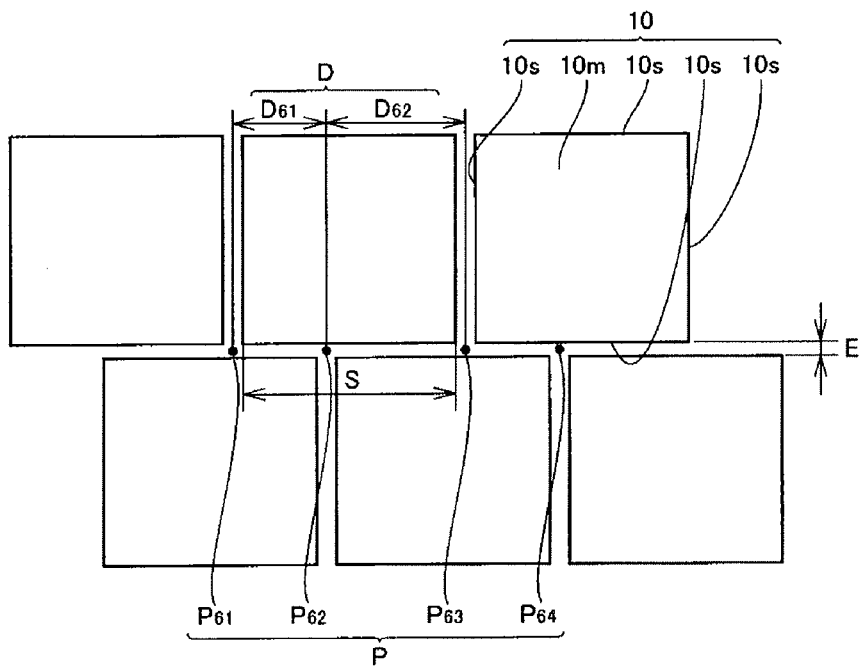
FIG. 6 is a schematic plan view of another arrangement example of tile substrates in a method for growing a group III nitride crystal according to an embodiment of the present invention.

In contrast, referring to FIG. 6, in the method for growing a group III nitride crystal according to the embodiment of the present invention, the tile substrates 10 including the main surfaces 10m having the shape of, for example, a square are arranged so as to be two-dimensionally closely packed such that some of the tile substrates 10 and the other tile substrates 10 are arranged by being shifted each other, and thus the vertexes of some of the tile substrates 10 do not oppose those of the other tile substrates 10. Specifically, at points P across which vertexes of the tile substrates 10 oppose one another (for example, points $P_{61}$, $P_{62}$, $P_{63}$, and $P_{64}$), two vertexes oppose one another at each point P. Thus, as a result of such two-dimensional close packing, at any point P across which vertexes of the tile substrates 10 oppose one another, three or less of the vertexes can be made to oppose one another. In the tile substrates 10 arranged in this manner, although there are a large number of points P (for example, points $P_{61}$, $P_{62}$, $P_{63}$, and $P_{64}$) across which vertexes of the tile substrates 10 oppose one another, gaps at points P are small and hence a group III nitride crystal epitaxially grown on the tile substrates 10 has a small number of pits formed in the main surface of the crystal. Thus, the yield of group III nitride crystal substrates from such group III nitride crystals is high.

In the two-dimensional close packing in FIG. 6, as for distance D between two neighboring points among a plurality of points P across which vertexes of the tile substrates 10 oppose one another, there are cases where, for example, distance $D_{61}$ between points $P_{61}$ and $P_{62}$ is different from distance $D_{62}$ between points $P_{62}$ and $P_{63}$. Distance $D_{61}$, distance $D_{62}$, and distance $D_0$ satisfy $D_0=D_{61}+D_{62}$. Distance $D_0$ is the sum of length S of a side of a tile substrate 10 including a square main surface and distance E between opposite side surfaces of neighboring tile substrates 10.

To further reduce the number of pits formed in the main surface of a group III nitride crystal epitaxially grown on the tile substrates 10, the distance between any two neighboring points among points across which vertexes of the tile substrates 10 oppose one another (in FIG. 6, distances $D_{61}$ and $D_{62}$) is preferably 10 µm or more, more preferably 100 µm or more, still more preferably 1,000 µm or more.

To epitaxially grow an integrated group III nitride crystal on the tile substrates 10 and to reduce the number of pits formed in the main surface of the grown group III nitride crystal, distance E between opposite side surfaces of neighboring tile substrate 10 is preferably 20 µm or less, more preferably 10 µM or less, still more preferably 2 µm or less, ideally 0 µm.

The cases where the main surfaces of the tile substrates have the shape of a square have been described with reference to FIGS. 5 and 6. Such description is similarly applied to cases where the main surfaces of the tile substrates have the shape of a rectangle, a rhombus, and any other parallelogram.

Step of Growing Group III Nitride Crystal

Referring to FIG. 2, the method for growing a group III nitride crystal according to the embodiment further includes a step of growing the group III nitride crystal 20 on the main surfaces 10m of the plurality of tile substrates 10 arranged. By growing the group III nitride crystal 20 on the main surfaces 10m of the tile substrates 10 arranged in the above-described manner, the group III nitride crystal 20 that has a large size and has a small number of pits formed in the main surface 20m can be provided. Thus, group III nitride crystal substrates having a large size can be obtained in a high yield from such group III nitride crystals.

A method used in the step of growing the group III nitride crystal 20 is not particularly limited. To epitaxially grow a group III nitride crystal having high crystallinity, preferred examples of such a growth method include vapor-phase methods such as an hydride vapor phase epitaxy (HVPE) method, a metal-organic chemical vapor deposition (MOCVD) method, a molecular beam epitaxy (MBE) method, and a sublimation method; and liquid-phase methods such as a flux method and a high-nitrogen-pressure solution method. Of these growth methods, the HVPE method is particularly preferred because a high crystal-growth rate is achieved.

Figure 7:
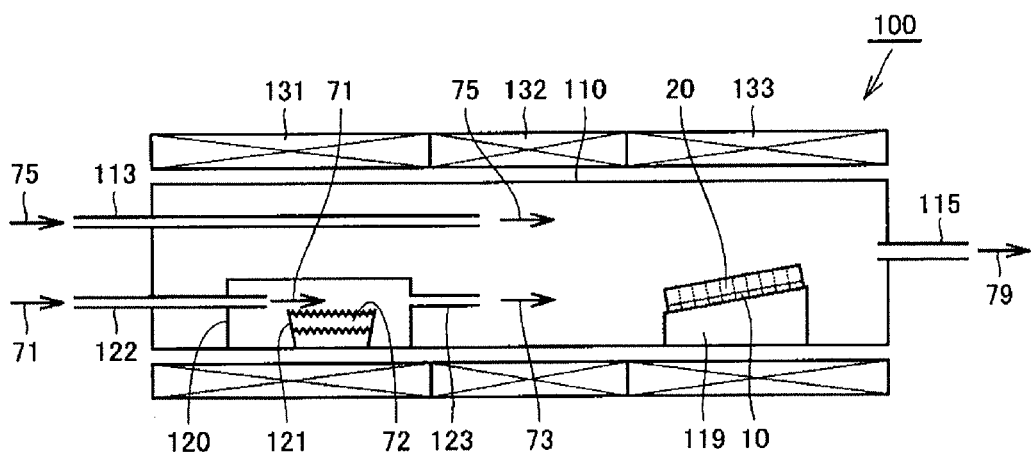
FIG. 7 is a schematic sectional view illustrating an example of a crystal growth method employed in a method for growing a group III nitride crystal according to an embodiment of the present invention.

Referring to FIG. 7, a procedure of growing the group III nitride crystal 20 by an HVPE method will be described. As illustrated in FIG. 7, an HVPE apparatus 100 includes a reaction chamber 110, a group HI element source gas generation chamber 120, and heaters 131, 132, and 133 for heating the reaction chamber 110 and the group III element source gas generation chamber 120. The reaction chamber 110 and the group III element source gas generation chamber 120 are equipped with a HCl gas introduction pipe 122 for introducing a HCl gas 71 into the group III element source gas generation chamber 120. The group III element source gas generation chamber 120 includes a group III element source boat 121 into which a group III element source 72 is placed. The group III element source gas generation chamber 120 is equipped with a group III element source gas introduction pipe 123 for introducing a generated group III element source gas 73 into the reaction chamber 110. The reaction chamber 110 is equipped with a nitrogen source gas introduction pipe 113 for introducing a nitrogen source gas 75 into the reaction chamber 110 and a gas exhaust pipe 115 for exhausting the reaction chamber 110 of an exhaust gas 79. The reaction chamber 110 includes a crystal holder 119 on which the tile substrates 10 for growing the group III nitride crystal 20 are arranged. A reaction tube for forming the reaction chamber 110 is not particularly limited and a quartz reaction tube is preferably used because large quartz reaction tubes are readily produced.

The HCl gas 71 is introduced through the HCl gas introduction pipe 122 into the group III element source gas generation chamber 120. The group III element source gas generation chamber 120 includes the group III element source boat 121 containing the group III element source 72. The group III element source 72 reacts with the HCl gas 71 to produce a group III element chloride gas serving as the group III element source gas 73.

The group III element source gas 73 is introduced from the group III element source gas generation chamber 120 through the group III element source gas introduction pipe 123 into the reaction chamber 110. $NH_3$ gas serving as the nitrogen source gas 75 is introduced through the nitrogen source gas introduction pipe 113 into the reaction chamber 110.

The group III element source gas 73 reacts with the nitrogen source gas 75 in the reaction chamber 110 to grow the group III nitride crystal 20 on the main surfaces 10m of the tile substrates 10 arranged on the crystal holder 119 in a crystal growth section. The reaction chamber 110 is exhausted of excessive gas as the exhaust gas 79 through the gas exhaust pipe 115. At this time, a carrier gas is used to efficiently transport the group III element source gas and the nitrogen source gas and to adjust the partial pressures of the source gases. Examples of such a carrier gas include hydrogen gas ($H_2$ gas) and nitrogen gas ($N_2$ gas).

Hereafter, a term "source gas introduction section" refers to a section, in the reaction chamber 110, that includes an area where the HCl gas introduction pipe 122, the group III element source gas generation chamber 120, the group III element source gas introduction pipe 123, and the nitrogen source gas introduction pipe 113 are disposed and a region around the area and that is mainly heated with the heaters 131 and 132. Hereafter, the term "crystal growth section" refers to a section, in the reaction chamber 110, that includes an area where the crystal holder 119 is disposed and a region around the area and that is mainly heated with the heater 133. To efficiently grow the group III nitride crystal 20 on the main surfaces 10m of the tile substrates 10, the atmosphere temperature of the source gas introduction section (hereafter, referred to as "group III element source gas generation temperature") is adjusted within the range of about 800° C. or more and about 900° C. or less; and the atmosphere temperature of the crystal growth section (hereafter, referred to as "crystal growth temperature") is adjusted within the range of about 900° C. or more and about 1300° C. or less.

Thus, the group III nitride crystal 20 is integrally grown on the main surfaces 10m of the tile substrates 10 to provide the group III nitride crystal 20 that has a large size and has a small number of pits 20p formed in the main surface 20m of the group III nitride crystal 20.

When a GaN crystal is grown as the group III nitride crystal 20 by the HVPE method, the crystal growth temperature is preferably in the range of 900° C. or more and 1300° C. or less. When the crystal growth temperature is less than 900° C., the resultant crystal has low crystallinity. When the crystal growth temperature is more than 1300° C., the HVPE apparatus bears a heavy load.

When a GaN crystal is grown by an existing method for growing a group III nitride crystal (that is, a method for growing a group III nitride crystal on main surfaces of tile substrates that are two-dimensionally closely packed such that, at points across which vertexes of the tile substrates oppose one another, four or more of the vertexes oppose one another at each point), a pit formation percentage in terms of pits formed in the main surface of the crystal is high at a crystal growth temperature in the range of 900° C. or more and 1100° C. or less.

In contrast, when a GaN crystal is grown by the method for growing a group III nitride crystal according to the embodiment (that is, a method for growing a group III nitride crystal on main surfaces of tile substrates that are two-dimensionally closely packed such that, at any point across which vertexes of the tile substrates oppose one another, three or less of the vertexes oppose one another), a pit formation percentage in terms of pits formed in the main surface of the crystal can be reduced at a crystal growth temperature in the range of 900° C. or more and 1100° C. or less. Therefore, the method for growing a group III nitride crystal according to the embodiment is advantageous in the growth of a group III nitride crystal (for example, a GaN crystal) by an HVPE method at a crystal growth temperature in the range of 900° C. or more and 1100° C. or less.

EXAMPLES

Example A

1. Preparation of Tile Substrates

A GaN mother crystal was cut parallel to a (0001) plane with a wire saw to produce wafers. These wafers were two-dimensionally cut parallel to a {1-100} plane and parallel to a {11-20} plane. The cut surfaces of the wafers were polished by chemical mechanical polishing (CMP). Thus, a large number of GaN tile substrates having the shape of a square plate with sides of 16 mm±1 μm and a thickness of 400 μm±1 μm were provided in which main surfaces were in the (0001) plane; the main surfaces tilted away at 0.1° or less from the (0001) plane; side surfaces were in the {1-100} plane and the {11-20} plane; the side surfaces tilted away at 0.1° or less from the {1-100} plane or the {11-20} plane; and interior angles of vertexes in the main surfaces and the side surfaces were 90°±0.1°. The dimensions of the tile substrates were measured with a dial gauge. The main surfaces and the side surfaces of the GaN tile substrates were measured in terms of mean roughness Ra with an AFM (atomic force microscope) and were found to have a mean roughness Ra of 5 nm or less.

2. Arrangement of Tile Substrates

Referring to FIGS. 1A and 1B, the thus-obtained GaN tile substrates were arranged in four patterns such that, with respect to distances D (specifically, distances $D_{11}$ and $D_{12}$) between any two neighboring points among points P across which vertexes of the GaN tile substrates opposed one another, the shorter distance $D_{11}$ was within the range of 1 μm±1 μM (Example A-1), 10 μm±1 μm (Example A-2), 100 μm±1 μm (Example A-3), and 1000 μm±1 μm (Example A-4). In each of Examples, 10 sheets of the GaN tile substrates were arranged in the <1-100> direction and 10 sheets of the GaN tile substrates were arranged in the <11-20> direction and hence 100 sheets in total were two-dimensionally closely packed. The distance between neighboring side surfaces of neighboring GaN tile substrates was determined by observation with a microscope and was found to be 2 μm or less.

Referring to FIG. 1A, a substrate that was formed by two-dimensionally closely packing 100 sheets of the GaN tile substrates including main surfaces having the shape of a square with sides of 16 mm±1 μm and that had a square main surface having sides of about 160 mm, was of sufficient size to contain a circle C having a diameter of 6 inches (152.4 mm).

In Example A-1, for each pair of points $P_1$ and $P_2$, points $P_3$ and $P_4$, points $P_5$ and $P_6$, points $P_7$ and $P_8$, points $P_9$ and $P_{10}$, points $P_{11}$ and $P_{12}$, points $P_{13}$ and $P_{14}$, points $P_{15}$ and $P_{16}$, and points $P_{17}$ and $P_{18}$, the points were substantially at the same position; the number of points across which vertexes of the GaN tile substrates opposed one another was 81; and the number of vertexes opposing one another at each point was 4. Accordingly, Example A-1 employed an existing arrangement of tile substrates. In contrast, in Examples A-2, A-3, and A-4, the number of points across which vertexes of the GaN tile substrates opposed one another was 162; and the number of the vertexes opposing one another at each point was 2. Accordingly, Examples A-2, A-3, and A-4 employed arrangements of tile substrates according to embodiments of the present invention.

3. Growth of Group III Nitride Crystal

In each of Examples A-1 to A-4, a GaN crystal was grown by an HVPE method on the main surfaces of 100 sheets of the GaN tile substrates two-dimensionally closely packed. As for crystal growth conditions, the partial pressure of HCl gas was 10 kPa; the generation temperature of GaCl gas (group III element source gas) was 850° C.; the partial pressure of $NH_3$ gas (nitrogen source gas 75) was 20 kPa; the partial pressure of $H_2$ gas (carrier gas) was 70 kPa; and the crystal growth temperature was 1050° C. The GaN crystal was grown under these conditions for 10 hours in each Example to provide an integrated GaN crystal having dimensions of about 160 mm×160 mm×2000 μm (thickness). Thus, GaN crystal substrates having a diameter of 6 inches (152.4 mm) were obtained from the GaN crystals in Examples A-1 to A-4. The number of pits formed in the main surface of the GaN crystal in each Example was determined. Specifically, the number of pits was determined by observing a fluorescent image of the main surface with a microscope with a 365-nm-wavelength mercury lamp serving as a light source and counting the number of growth marks of facets forming the pits. The number of pits was divided by the number of points across which vertexes of the GaN tile substrates opposed one another to provide a pit formation percentage (%). The number of points across which vertexes of the GaN tile substrates opposed one another, the number of pits, and the pit formation percentage in Examples A-1 to A-4 are summarized in Table I below.

TABLE I

| Example A Side surfaces of tile substrates: {1-100}, {11-20} GaN crystal growth temperature: 1050° C. | Example A-1 | Example A-2 | Example A-3 | Example A-4 |
|---|---|---|---|---|
| Shorter distance out of distances between any two neighboring points (μm) | 1 ± 1 | 10 ± 1 | 100 ± 1 | 1000 ± 1 |
| Number of vertexes at any point across which vertexes opposed one another | 4 | 2 | 2 | 2 |
| Number of points | 81 | 162 | 162 | 162 |
| Number of pits | 72 | 68 | 14 | 11 |
| Pit formation percentage (%) | 88.9 | 42.0 | 8.6 | 6.8 |

Example B

1. Preparation of Tile Substrates

A GaN mother crystal was cut parallel to a (0001) plane with a wire saw to produce wafers. These wafers were two-dimensionally cut parallel to a {31-40} plane and a plane perpendicular to both the {31-40} plane and the {0001 } plane. The cut surfaces of the wafers were polished by chemical mechanical polishing (CMP). Thus, a large number of GaN tile substrates having the shape of a square plate having sides of 16 mm±1 µm and a thickness of 400 µm±1 µm were provided in which main surfaces were in the (0001) plane; the main surfaces tilted away at 0.1° or less from the (0001) plane; side surfaces were in the {31-40} plane or the plane perpendicular to both the {31-40} plane and the {0001} plane; the side surfaces tilted away at 0.1° or less from the {31-40} plane or the plane perpendicular to both the {31-40} plane and the {0001} plane; and interior angles of vertexes in the main surfaces and the side surfaces were 90°±0.1°. The main surfaces and the side surfaces of the GaN tile substrates were found to have a mean roughness Ra of 5 nm or less.

2. Arrangement of Tile Substrates

Referring to FIGS. 1A and 1B, the thus-obtained GaN tile substrates were arranged in four patterns such that, with respect to distances D (specifically, distances $D_{11}$ and $D_{12}$) between any two neighboring points among points P across which vertexes of the GaN tile substrates opposed one another, the shorter distance $D_{11}$ was within the range of 1 µm±1 µm (Example B-1), 10 µm±1 µm (Example B-2), 100 µm±1 µm (Example B-3), and 1000 µm±1 µm (Example B-4). In each of Examples, 10 sheets of the GaN tile substrates were arranged in the <31-40> direction and 10 sheets of the GaN tile substrates were arranged in a direction perpendicular to the <31-40> direction and <0001> direction and hence 100 sheets in total were two-dimensionally closely packed. The distance between neighboring side surfaces of neighboring GaN tile substrates was found to be 2 µm or less.

Referring to FIG. 1A, a substrate that was formed by two-dimensionally closely packing 100 sheets of the GaN tile substrates including main surfaces having the shape of a square with sides of 16 mm±1 µm and that had a square main surface having sides of about 160 mm, was of sufficient size to contain a circle C having a diameter of 6 inches (152.4 mm).

In Example B-1, for each pair of points $P_1$ and $P_2$, points $P_3$ and $P_4$, points $P_5$ and $P_6$, points $P_7$ and $P_8$, points $P_9$ and $P_{10}$, points $P_{11}$ and $P_{12}$, points $P_{13}$ and $P_{14}$, points $P_{15}$ and $P_{16}$, and points $P_{17}$ and $P_{18}$, the points were at the same position; the number of points across which vertexes of the GaN tile substrates opposed one another was 81; and the number of the vertexes opposing one another at each point was 4. Accordingly, Example B-1 employed an existing arrangement of tile substrates. In contrast, in Examples B-2, B-3, and B-4, the number of points across which vertexes of the GaN tile substrates opposed one another was 162; and the number of the vertexes opposing one another at each point was 2. Accordingly, Examples B-2, B-3, and B-4 employed arrangements of tile substrates according to embodiments of the present invention.

3. Growth of Group III Nitride Crystal

In each of Examples B-1 to B-4, a GaN crystal was grown as in Example A. In each Example, an integrated GaN crystal having dimensions of about 160 mm×160 mm×2000 µm (thickness) was provided. Thus, GaN crystal substrates having a diameter of 6 inches (152.4 mm) were obtained from the GaN crystals in Examples B-1 to B-4.

The number of pits formed in the main surface of the GaN crystal in each Example was determined and a pit formation percentage (%) was calculated as in Example A. The number of points across which vertexes of the GaN tile substrates opposed one another, the number of pits, and the pit formation percentage in Examples B-1 to B-4 are summarized in Table II below.

TABLE II

| Example B<br>Side surfaces of tile substrates:<br>{31-40}, plane perpendicular to both {31-40} and {0001}<br>GaN crystal growth temperature: 1050° C. | Example B-1 | Example B-2 | Example B-3 | Example B-4 |
|---|---|---|---|---|
| Shorter distance out of distances between any two neighboring points (µm) | 1 ± 1 | 10 ± 1 | 100 ± 1 | 1000 ± 1 |
| Number of vertexes at any point across which vertexes opposed one another | 4 | 2 | 2 | 2 |
| Number of points | 81 | 162 | 162 | 162 |
| Number of pits | 46 | 22 | 10 | 7 |
| Pit formation percentage (%) | 56.8 | 13.6 | 6.2 | 4.3 |

Example C

1. Preparation of Tile Substrates

A large number of GaN tile substrates were provided as in Example A. In the GaN tile substrates, main surfaces were in the (0001) plane; the main surfaces tilted away at 0.1° or less from the (0001) plane; side surfaces were in the {1-100} plane or the {11-20} plane; the side surfaces tilted away at 0.1° or less from the {1-100} plane or the {11-20} plane; and interior angles of vertexes in the main surfaces and the side surfaces were 90°±0.1°. The GaN tile substrates had sides of 16 mm±1 µm and a thickness of 400 µm±1 µm. The main surfaces and the side surfaces of the GaN tile substrates were found to have a mean roughness Ra of 5 nm or less.

2. Arrangement of Tile Substrates 100 sheets of the GaN tile substrates obtained from the foregoing procedure in total were two-dimensionally closely packed as in Example A. The distance between neighboring side surfaces of neighboring GaN tile substrates was found to be 2 µm or less.

Referring to FIG. 1A, in Example C-1, for each pair of points $P_1$ and $P_2$, points $P_3$ and $P_4$, points $P_5$ and $P_6$, points $P_7$ and $P_8$, points $P_9$ and $P_{10}$, points $P_{11}$ and $P_{12}$, points $P_{13}$ and $P_{14}$, points $P_{15}$ and $P_{16}$, and points $P_{17}$ and $P_{18}$, the points were substantially at the same position; the number of points across which vertexes of the GaN tile substrates opposed one another was 81; and the number of the vertexes opposing one another at each point was 4. Accordingly, Example C-1 employed an existing arrangement of tile substrates. In contrast, in Examples C-2, C-3, and C-4, the number of points across which vertexes of the GaN tile substrates opposed one another was 162; and the number of the vertexes opposing one another at each point was 2. Accordingly, Examples C-2, C-3, and C-4 employed arrangements of tile substrates according to embodiments of the present invention.

3. Growth of Group III Nitride Crystal

In each of Examples C-1 to C-4, a GaN crystal was grown by an HVPE method on the main surfaces of 100 sheets of the GaN tile substrates two-dimensionally closely packed. As for crystal growth conditions, the partial pressure of HCl gas was 10 kPa; the generation temperature of GaCl gas (group III element source gas) was 850° C.; the partial pressure of $NH_3$ gas (nitrogen source gas 75) was 20 kPa; the partial pressure of $N_2$ gas (carrier gas) was 70 kPa; and the crystal growth temperature was 1135° C. The GaN crystal was grown under these conditions for 10 hours in each Example to provide an integrated GaN crystal having dimensions of about 160 mm×160 mm×2000 μm (thickness). Thus, GaN crystal substrates having a diameter of 6 inches (152.4 mm) were obtained from the GaN crystals in Examples C-1 to C-4. The number of pits formed in the main surface of the GaN crystal in each Example was determined and a pit formation percentage (%) was calculated as in Example A. The number of points across which vertexes of the GaN tile substrates opposed one another, the number of pits, and the pit formation percentage in Examples C-1 to C-4 are summarized in Table III below.

TABLE III

| Example C<br>Side surfaces of<br>tile substrates:<br>{1-100}, {11-20}<br>GaN crystal growth<br>temperature: 1135° C. | Example C-1 | Example C-2 | Example C-3 | Example C-4 |
|---|---|---|---|---|
| Shorter distance out of distances between any two neighboring points (μm) | 1 ± 1 | 10 ± 1 | 100 ± 1 | 1000 ± 1 |
| Number of vertexes at any point across which vertexes opposed one another | 4 | 2 | 2 | 2 |
| Number of points | 81 | 162 | 162 | 162 |
| Number of pits | 28 | 8 | 6 | 2 |
| Pit formation percentage (%) | 34.6 | 4.9 | 3.7 | 1.2 |

Example D

1. Preparation of Tile Substrates

A large number of GaN tile substrates were provided as in Example B. In the GaN tile substrates, main surfaces were in the (0001) plane; the main surfaces tilted away at 0.1° or less from the (0001) plane; side surfaces were in the {31-40} plane or the plane perpendicular to both the {31-40} plane and the {0001} plane; the side surfaces tilted away at 0.1° or less from the {31-40} plane or the plane perpendicular to both the {31-40} plane and the {0001} plane; and interior angles of vertexes in the main surfaces and the side surfaces were 90°±0.1°. The GaN tile substrates had sides of 16 mm±1 μm and a thickness of 400 μm±1 μm. The main surfaces and the side surfaces of the GaN tile substrates were found to have a mean roughness Ra of 5 nm or less.

2. Arrangement of Tile Substrates 100 sheets of the GaN tile substrates obtained from the foregoing procedure in total were two-dimensionally closely packed as in Example B. The distance between neighboring side surfaces of neighboring GaN tile substrates was found to be 2 μm or less.

Referring to FIG. 1A, in Example D-1, for each pair of points $P_1$ and $P_2$, points $P_3$ and $P_4$, points $P_5$ and $P_6$, points $P_7$ and $P_8$, points $P_9$ and $P_{10}$, points $P_{11}$ and $P_{12}$, points $P_{13}$ and $P_{14}$, points $P_{15}$ and $P_{16}$, and points $P_{17}$ and $P_{18}$, the points were substantially at the same position; the number of points across which vertexes of the GaN tile substrates opposed one another was 81; and the number of the vertexes opposing one another at each point was 4. Accordingly, Example D-1 employed an existing arrangement of tile substrates. In contrast, in Examples D-2, D-3, and D-4, the number of points across which vertexes of the GaN tile substrates opposed one another was 162; and the number of vertexes opposing one another at each point was 2. Accordingly, Examples D-2, D-3, and D-4 employed arrangements of tile substrates according to embodiments of the present invention.

3. Growth of Group III Nitride crystal

In each of Examples D-1 to D-4, a GaN crystal was grown as in Example C. In each Example, an integrated GaN crystal having dimensions of about 160 mm×160 mm×2000 μm (thickness) was provided. Thus, GaN crystal substrates having a diameter of 6 inches (152.4 mm) were obtained from the GaN crystals in Examples D-1 to D-4. The number of pits formed in the main surface of the GaN crystal in each Example was determined and a pit formation percentage (%) was calculated as in Example A. The number of points across which vertexes of the GaN tile substrates opposed one another, the number of pits, and the pit formation percentage in Examples D-1 to D-4 are summarized in Table IV below.

TABLE IV

| Example D<br>Side surfaces of<br>tile substrates:<br>{31-40}, plane<br>perpendicular to both<br>{31-40} and {0001}<br>GaN crystal growth<br>temperature: 1135° C. | Example D-1 | Example D-2 | Example D-3 | Example D-4 |
|---|---|---|---|---|
| Shorter distance out of distances between any two neighboring points (μm) | 1 ± 1 | 10 ± 1 | 100 ± 1 | 1000 ± 1 |
| Number of vertexes at any point across which vertexes opposed one another | 4 | 2 | 2 | 2 |
| Number of points | 81 | 162 | 162 | 162 |
| Number of pits | 14 | 3 | 3 | 0 |
| Pit formation percentage (%) | 17.3 | 1.9 | 1.9 | 0.0 |

The pit formation percentages in Examples A to D in Tables I to IV are summarized in Table V below.

TABLE V

| | | Shorter distance out of distances between any two neighboring points (μm) | | | |
|---|---|---|---|---|---|
| | | 1 ± 1 | 10 ± 1 | 100 ± 1 | 1000 ± 1 |
| Pit formation percentage (%) | Example A<br>Side surfaces of tile substrates:<br>{1-100}, {11-20}<br>GaN crystal growth temperature: 1050° C. | 88.9 | 42.0 | 8.6 | 6.8 |
| | Example B<br>Side surfaces of tile substrates:<br>{31-40}, plane perpendicular to both {31-40} and {0001}<br>GaN crystal growth temperature: 1050° C. | 56.8 | 13.6 | 6.2 | 4.3 |

TABLE V-continued

|  | Shorter distance out of distances between any two neighboring points (μm) | | | |
|---|---|---|---|---|
|  | 1 ± 1 | 10 ± 1 | 100 ± 1 | 1000 ± 1 |
| Example C<br>Side surfaces<br>of tile substrates:<br>{1-100}, {11-20}<br>GaN crystal growth<br>temperature: 1135° C. | 34.6 | 4.9 | 3.7 | 1.2 |
| Example D<br>Side surfaces<br>of tile substrates:<br>{31-40}, plane<br>perpendicular to both<br>{31-40} and {0001}<br>GaN crystal growth<br>temperature: 1135° C. | 17.3 | 1.9 | 1.9 | 0.0 |

Figure 8:
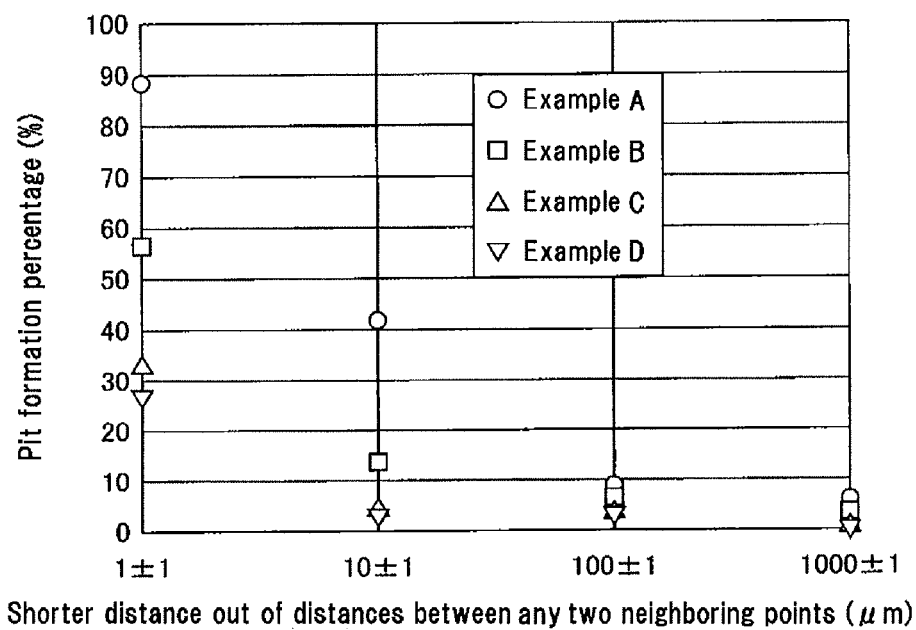
FIG. 8 is a graph illustrating the relationship between a pit formation percentage in the main surface of a group III nitride crystal and a shorter distance out of distances between two neighboring points among points across which vertexes of tile substrates oppose one another in methods for growing a group III nitride crystal.

FIG. 8 illustrates the relationship between the pit formation percentage and a shorter distance out of distances between two neighboring points among points across which vertexes of the tile substrates opposed one another in terms of Examples A to D in Table V.

Referring to Table V and FIG. 8, in all the Examples A to D, when a shorter distance out of distances between two neighboring points among points across which vertexes of the tile substrates opposed one another is 1 μm±1 μm (in this case, two points in terms of the shorter distance are substantially at the same position and the number of vertexes of the GaN tile substrates at each point across which the vertexes oppose one another is 4), the pit formation percentage in the main surfaces of the GaN crystals (group III nitride substrates) is high. In contrast, when the shorter distance is 10μm±1 μm, 100 μm±1 μm, or 1000 μm±1 μm (in each case, the number of vertexes of the GaN tile substrates at each point across which the vertexes oppose one another is 2), the pit formation percentage is low. In addition, as the shorter distance increases from 10 μm±1 μm, 100 μm±1 μm, to 1000 μm±1 μm, the pit formation percentage decreases.

Comparison between Examples A and C and Examples B and D shows that the pit formation percentage is low when the side surfaces of tile substrates are in at least one plane of the {31-40} plane and the plane perpendicular to both the {31-40} plane and the {0001} plane, compared with cases where the side surfaces of tile substrates are in the {1-100} plane or the {11-20} plane.

Comparison between Examples A and B and Examples C and D shows that, under the same conditions of arranging tile substrates and the same conditions of growing a GaN crystal except that the crystal growth temperature of the GaN crystal (group III nitride crystal) is a high temperature of more than 1100° C. and 1300° C. or less (for example, 1135° C.), the pit formation percentage is low, compared with cases where the crystal growth temperature is a low temperature of 900° C. or more and 1100° C. or less (for example, 1050° C.). In contrast, compared with cases where the crystal growth temperature of the GaN crystal (group III nitride crystal) is a high temperature of more than 1100° C. and 1300° C. or less (for example, 1135° C.), in the cases where the crystal growth temperature is a low temperature of 900° C. or more and 1100° C. or less (for example, 1050° C.), the degree of a decrease in the pit formation percentage is high as the shorter distance out of distances between two neighboring points among points across which vertexes of the tile substrates oppose one another increases.

Embodiments and Examples disclosed herein are given by way of illustration in all the respects, and not by way of limitation. The scope of the present invention is indicated not by the above descriptions but by Claims and embraces all the modifications within the meaning and range of equivalency of the Claims.

REFERENCE SIGNS LIST

10: tile substrate;
10m, 20m: main surface;
10s: side surface;
20: group III nitride crystal;
20p: pit;
71: HCl gas;
72: group III element source;
73: group III element source gas;
75: nitrogen source gas;
79: exhaust gas;
100: HYPE apparatus;
110: reaction chamber;
113: nitrogen source gas introduction pipe;
115: gas exhaust pipe;
119: crystal holder;
120: group III element source gas generation chamber;
121: group III element source boat;
122: HCl gas introduction pipe;
123: group III element source gas introduction pipe;
131, 132, 133: heater

The invention claimed is:

1. A method for growing a group III nitride crystal, comprising:
   a step of preparing a plurality of tile substrates including main surfaces having a shape of a triangle or a convex quadrangle that allows two-dimensional close packing of the plurality of tile substrates;
   a step of arranging the plurality of tile substrates so as to be two-dimensionally closely packed such that, at any point across which vertexes of the plurality of tile substrates oppose one another, 3 or less of the vertexes oppose one another; and
   a step of growing a group III nitride crystal on the main surfaces of the plurality of tile substrates arranged.

2. The method according to claim 1, wherein the shape of the main surfaces of the plurality of tile substrates is the convex quadrangle that allows two-dimensional close packing of the plurality of tile substrates.

3. The method according to claim 1, wherein the plurality of tile substrates are GaN substrates.

4. The method according to claim 1, wherein, in the step of growing the group III nitride crystal, a GaN crystal is grown as the group III nitride crystal in a temperature range of 900° C. or more and 1100° C. or less by a hydride vapor phase epitaxy method.

5. The method according to claim 1, wherein, in the step of arranging the plurality of tile substrates so as to be two-dimensionally closely packed, the plurality of tile substrates are arranged such that a distance between any two neighboring points among the points across which the vertexes of the plurality of tile substrates oppose one another is 10 μm or more.

* * * * *